(12) United States Patent
Moore

(10) Patent No.: US 7,903,475 B2
(45) Date of Patent: Mar. 8, 2011

(54) LATCH PULSE DELAY CONTROL

(76) Inventor: Charles H. Moore, Sierra City, CA (US)

(*) Notice: Subject to any disclaimer, the term of this patent is extended or adjusted under 35 U.S.C. 154(b) by 153 days.

(21) Appl. No.: 12/416,433

(22) Filed: Apr. 1, 2009
(Under 37 CFR 1.47)

(65) Prior Publication Data
US 2010/0254197 A1    Oct. 7, 2010

(51) Int. Cl.
*G11C 7/10* (2006.01)
(52) U.S. Cl. .................................. 365/189.05; 365/194
(58) Field of Classification Search ............. 365/189.05, 365/194
See application file for complete search history.

(56) References Cited

U.S. PATENT DOCUMENTS
6,078,528 A * 6/2000 Johnson et al. .......... 365/189.05
* cited by examiner

*Primary Examiner* — Son Dinh
*Assistant Examiner* — Nam Nguyen
(74) *Attorney, Agent, or Firm* — Henneman & Associates, PLC; Larry E. Henneman, Jr.

(57) ABSTRACT

A novel memory circuit includes a pulse line, a memory latch including an enable port, and a pulse delay element interposed between the pulse line and the enable port of the memory latch. In a particular embodiment, the pulse delay element includes a series of logic gates. In a more particular embodiment, the series of logic gates include a feedback line for disconnecting the enable port from the pulse line. In another particular embodiment, the enable ports of two different memory latches are connected to the same pulse line via two different latch pulse delay elements, each having different delay times. In a more particular embodiment, the data output port of the first latch is connected to the data input port of the second latch.

19 Claims, 6 Drawing Sheets

LATCH PULSE DELAY CONTROL

BACKGROUND OF THE INVENTION

1. Field of the Invention

This invention relates generally to timing circuits in a computer processor, and more particularly to an improved circuit and method for controlling asynchronous circuits, especially in multiprocessor arrays on a single chip.

2. Description of the Background Art

In the art of computing, speed is a much desired quality, and the quest to create faster and more efficient computers and processors is ongoing. The operation of digital logic circuits in computer processors is generally coordinated by a clock signal that ensures appropriate sequential functioning of the component parts. A common technique used in the art is to hold information in edge-triggered flip-flops that can change their output state at clock signal transitions, with enable gates controlling readiness of logic outputs. With this technique, state changes in storage elements occur synchronously, in increments of one clock period or integer multiples thereof, sequentially in time, and only within a very narrow time interval, for example at the leading edge of the clock.

As design systems grow in complexity and clock speeds increase, several limitations in synchronous design become more problematic. Some of such limitations include the need for a large number of transistors, high power consumption, and slow speeds due in part to what is known as designing for the "worst case performance." In particular, clock distribution over a whole circuit consumes a lot of power because the clock and other circuit elements (e.g., clock buffers, latches, and combinational logic) are constantly operating, even at times when no useful function is being performed. Furthermore, because a synchronous circuit is driven with a constant clock rate, the clock period must be long enough to constantly comply with the worst case computation delay under worst case process, voltage, and temperature conditions. This ultimately leads to slower performance because processes that are completed have to wait for unfinished processes to be completed before they can begin a new process.

In efforts to avoid such limitations, circuit designers have begun to explore the benefits provided by asynchronously-operating systems. In asynchronously-operating systems, data transfer handshake signals and standard delays are two known methods used to enable sequential events to proceed at their actual pace rather than during a predetermined number of clock cycles. Accordingly, asynchronous circuits can have a speed advantage, require fewer transistors to implement, and need less operating power, as only the active circuits are operating at a given moment. Mixed designs are also known to those skilled in the art. Such designs utilize a clock in parts of the circuit, and asynchronous features in others.

Although asynchronously-operating systems provide several advantages over synchronously-operating systems, there are still several disadvantages to overcome. For example, subsystems within an asynchronous system communicate via handshakes, which leads to the need for additional circuitry and operations. As another example, the problem of mistiming between events is common because asynchronously-operating systems are not clock-driven, and therefore, do not operate in a predetermined time domain.

What is needed, therefore, is a system to overcome the problem of mistiming in next generation computer processors utilizing asynchronous features, especially in multiprocessor arrays used in single-chip embedded systems.

SUMMARY

The present invention overcomes the problems associated with the prior art by providing a latch pulse delay control system for delaying the latching of data in an asynchronously-operating computer. The invention facilitates delaying the latch pulse signal delivered to a data latch such that mistiming in the computer's data storage system is avoided.

A latch pulse delay apparatus, such as a latch pulse delay circuit, is disclosed. The latch pulse delay circuit includes a first memory latch that has a latch enable port, a data input port, and an output port. The latch pulse delay circuit also includes a pulse line that provides electrical pulse signals, and a first pulse delay element that is electrically interposed between the pulse line and the enable port of the first memory latch. The first memory latch stores data applied to the data input port when the latch enable port receives a predetermined signal. The first pulse delay element imparts a predetermined latency to the pulse signals, moving from the pulse line to the latch enable port of the first memory latch. According to one embodiment, the first memory latch is a register in a data stack in a computer.

The first pulse delay element may include a variety of different elements. For example, the first pulse delay element may include at least one logic gate that is operative to increase the time it takes for the electrical pulse signals to move from the pulse line to the latch enable port of the first memory latch. The logic gate may be an enable gate (e.g., a NAND gate) having a first input port, a second input port, and an output port, where the first import port is electrically coupled to the pulse line, the second input port is electrically coupled to a signal line, and the output port is electrically coupled to the latch enable port of the first memory latch. As another example, the first pulse delay element may also include a plurality of inverters (in particular, an even number of inverters) connected in series and electrically interposed between the pulse line and the latch enable port. Moreover, the first pulse delay element may also include a feedback line having a first end electrically coupled to the enable port of the first memory latch and a second end electrically coupled to a third input port of the enable gate.

According to a particular embodiment of the invention, the latch pulse delay circuit may further include a second memory latch and a second pulse delay element. The second memory latch has a latch enable port, a data input port and an output port, and is operative to store a signal asserted on the data input port when its latch enable port receives a predetermined signal. Furthermore, the second pulse delay element is electrically interposed between the pulse line and the enable port of the second memory latch, and imparts a predetermined latency to the pulse signals moving from the pulse line to the enable port of the second memory latch. The predetermined latency caused by the first pulse delay element is greater than the predetermined latency caused by the second pulse delay element. Optionally, the data input port of the second memory latch may be connected to the data output port of the first memory latch.

According to a more particular embodiment, the first pulse delay element may include a first number of logic gates and the second pulse delay element may include a second number of gates, where the second number of logic gates is less than the first number of logic gates. Like the first pulse delay element, the second memory latch may include an enable gate and/or a feedback line having a first end electrically coupled to the latch enable port of the second memory latch and a second end electrically coupled to a third input of the enable gate of the second memory latch.

In another particular embodiment of the invention, the latch pulse delay circuit may include a sequencer that is electrically coupled to the pulse line and asserts a series of pulses on the pulse line. In the case of two memory latches, in response to the sequencer asserting one of the pulses on the pulse line, the first memory latch may store the signal asserted on its data input port after the second memory latch stores the signal asserted on its data input port.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a latch pulse delay control system. In the following description, numerous specific details are set forth (e.g., elements for implementing Boolean operations, etc.) in order to provide a thorough understanding of the invention. Those skilled in the art will recognize, however, that the invention may be practiced apart from these specific details. In other instances, details of well-known circuit components and manufacturing practices (e.g., power supplies, photolithography, etc.) have been omitted, so as to not unnecessarily deviate from the scope of the present invention.

Figure 1:
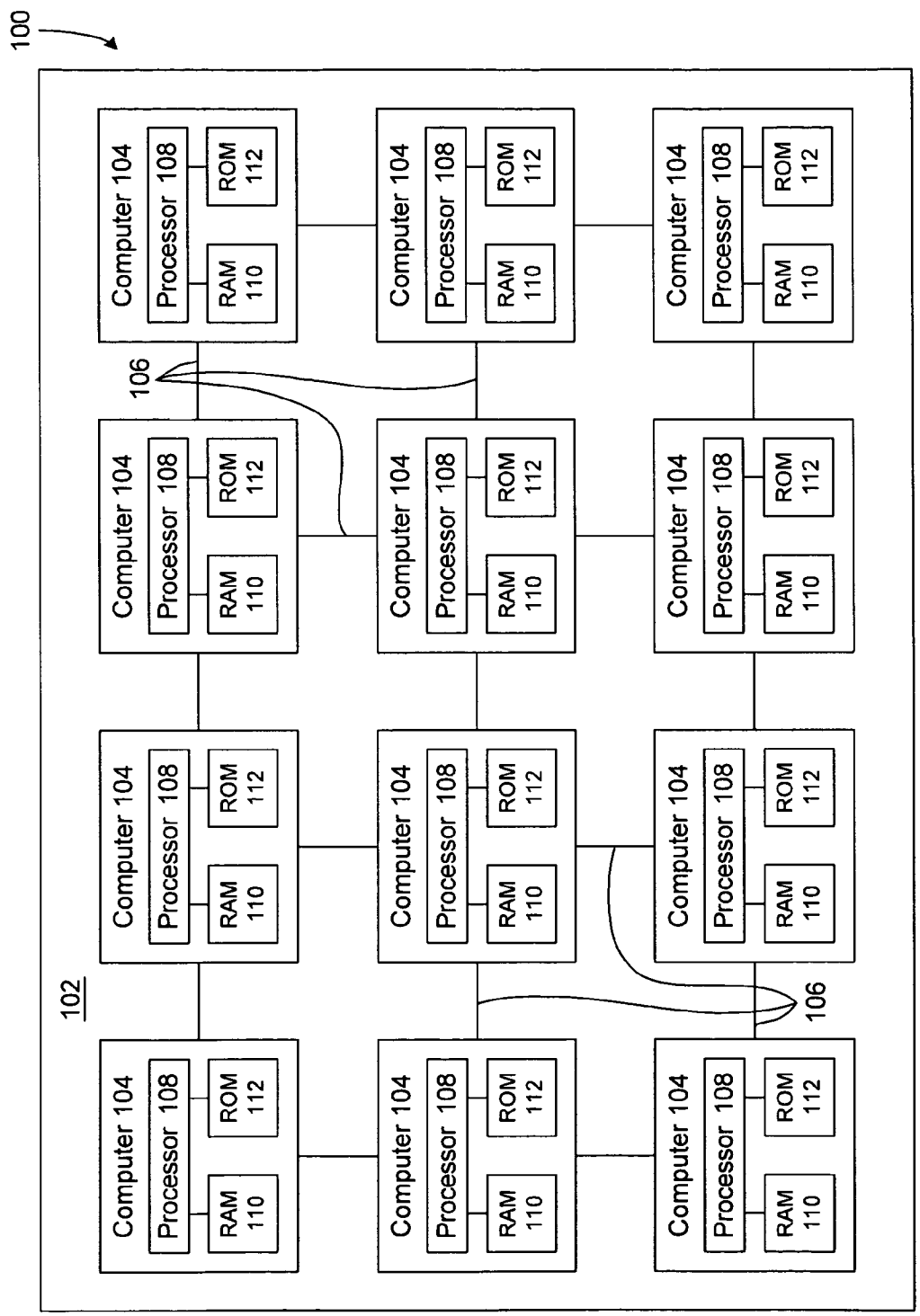
FIG. 1 shows a computer array according to one embodiment of the present invention.

FIG. 1 shows a computer array 100 formed on a single die 102. Computer array 100 includes a plurality (twelve in this example) of computers 104 (sometimes also referred to as "cores" or "nodes") interconnected by a plurality of buses 106. According to one embodiment of the present invention, computers 104 are generally independently functioning computers, each including an individual processor 108, RAM 110, ROM 112, and a sequencer (not shown in FIG. 1). In a particular embodiment, computers 104 may be stack-based computers and would, therefore, include one or more data stacks (not shown in FIG. 1). In this example, data buses 106 are bidirectional, asynchronous, high-speed, parallel data buses, although it is within the scope of the present invention that other interconnecting means might be employed. In the present embodiment of array 100, not only is data communication between computers 104 asynchronous, but individual computers 104 also operate in an internally-asynchronous mode. This provides important advantages. For example, because a clock signal does not have to be distributed throughout computer array 100, a great deal of power is saved. Furthermore, not having to distribute a clock signal sometimes eliminates many timing problems that could limit the size of array 100 or cause other known difficulties.

Figure 2:
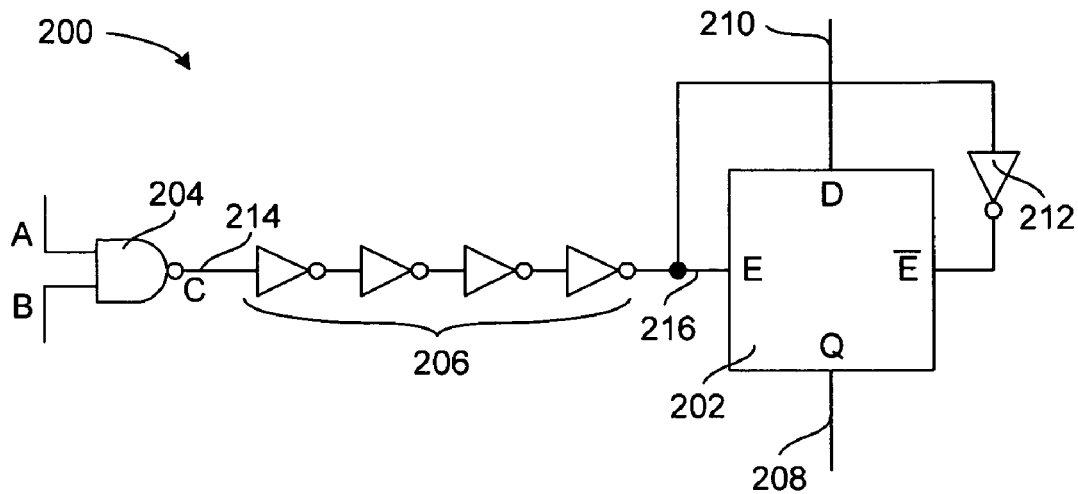
FIG. 2 is schematic diagram of a latch pulse delay circuit according to one embodiment of the present invention.

FIG. 2 shows a latch pulse delay circuit 200 which could be employed in, for example, RAM 110 of FIG. 1. Alternatively, latch pulse delay circuit 200 could be incorporated into a register or data stack. In the present embodiment, latch pulse delay circuit 200 includes a latch 202, a NAND (enable) gate 204, and a plurality of inverters 206 connected in series, where each of the inverters 206 have substantially similar characteristics. In alternate embodiments, however, inverters with dissimilar characteristics may be preferred, according to the application.

Latch 202 is a common latch known to those skilled in the art and operates as follows. When latch 202 is not enabled (in the quiescent state), the logical value on the output port Q, connected to an output wire 208, is unaffected by signal changes at the data input port D. When latch 202 is enabled by the appropriate logical signal provided at the enable input E, the logical value asserted on a wire 210 that is connected to port D is transferred to output port Q, after a latch delay time interval following the enable signal level change. It should be noted that although, in this embodiment, an inverted enable signal to latch 202 is provided through an inverter 212, latches with a single enable input can be employed as an alternative. It should be further noted that although a latch with a logical 0 (e.g., low) enable level is shown, a latch that is enabled in response to a logical 1 (e.g., high) can also be used with appropriate circuit changes.

Turning to the remainder of circuit 200, in the quiescent state, at least one of input ports A and B of NAND gate 204 is at signal level 0 (e.g., low), which results in the signal level 1 (e.g., high) being asserted on output port C of NAND gate 204. Output C of NAND gate 204 is further connected to wire 214, which is connected to the input end of the first inverter 206, while a wire 216 connects the output of the last inverter 206 to enable input E. The signal level asserted on output C will be the same as the signal level asserted on input E, owing to an even number of inverters 206 between wires 214 and 216.

Figure 3:
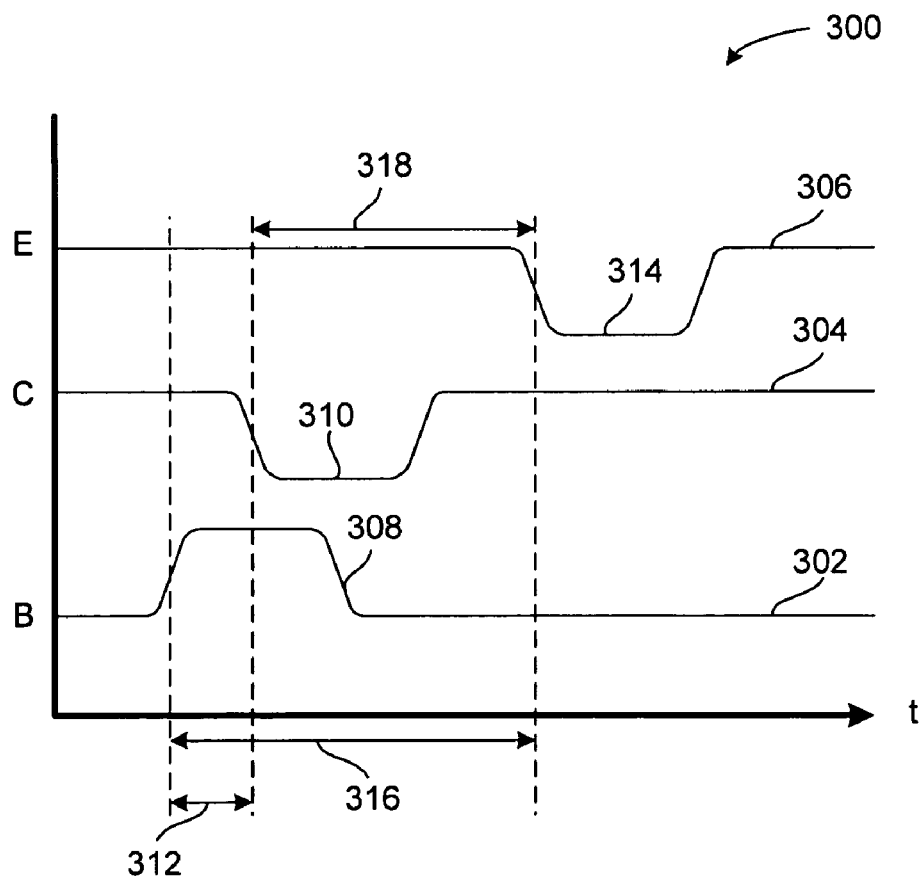
FIG. 3 is a timing diagram corresponding to the circuit of FIG. 2.

FIG. 3 is a timing diagram 300 of digital signals applied to circuit 200 with respect to time. In particular, digital signals 302, 304 and 306 correspond to signal levels asserted on input port B of NAND gate 204, output port C of NAND gate 204, and input port E of latch 202, respectively. As will be described in greater detail below, latching according to the present invention is effected by a latch pulse of a relatively large time duration compared to the clock transition times employed in synchronous systems of the prior art. Additionally, it may be desirable for the latch pulse to be applied to a plurality of latches. Owing to the operational relationship of latches with respect to one another, it is, therefore, desirable to enable different latches at different times after the initiation of a latch pulse. The present invention accomplishes this goal by providing a means for increasing or decreasing the time it takes for a latch pulse to reach the enable inputs of different latches, as will be more apparent in view of FIGS. 6 and 7 and their associated descriptions.

With reference to FIG. 3, circuit 200 operates as follows. In circuit 200, a register select signal level 1 (high) is applied to input port A, and a latch pulse 308, transitioning from signal level 0 (low) to signal level 1 (high), is applied to input port B. The register select signal may be generated, for example, by the processor 108 of the computer 104 incorporating circuit 204 when data is to be written to latch 202. As other examples, the register select signal my be generated by an instruction decoder circuit that controls the writing of data to RAM 110 or a register and/or a data stack of the computer 104. The register select signal may have a pulse width that is wider than the latch pulse 308, beginning before it and ending after it. For convenience, it will be assumed that the register select signal applied to input port A is already at a signal level of 1. A leading edge of a low-going pulse 310 of signal 304 arrives on output port C after a delay 312 which corresponds to the time it takes for NAND 204 to change the signal on output port C responsive to the signal changes on inputs A and B. The leading edge of latch pulse 308 arrives as a low-going enable pulse 314 at enable port E after a time delay 316, determined by the number of circuit elements (e.g., NAND gate 204 and inverters 206) in the circuit path between input port B and wire 216. In particular, delay 316 is the sum of delay 312, the delay 318 created by all of the inverters 206, and any wire delay.

Note that in this particular embodiment, delay 316 is longer than the width of the latch pulse 308. Thus, enable pulse 314 has approximately the same width as latch pulse 308. It should be obvious that the length of delay 318 is directly proportional to the number of inverters interposed between NAND gate 204 and enable port E. For example, if circuit 200 only included two inverters in the plurality of inverters 206, then the delay time caused by the two inverters would be approximately half of that shown for delay 318 (which corresponds to four inverters). Conversely, if circuit 200 included eight inverters in the plurality of inverters 206, then the delay time caused by the inverters would be approximately twice as long as delay 318. Thus, the total delay 316 can be advantageously varied by changing the number of inverters in the plurality of inverters 206 shown in the latch pulse delay circuit 200 in FIG. 2. Different total delays 316 are beneficial in systems where data is transferred between multiple latches, each activated by a particular latch pulse.

Figure 4:
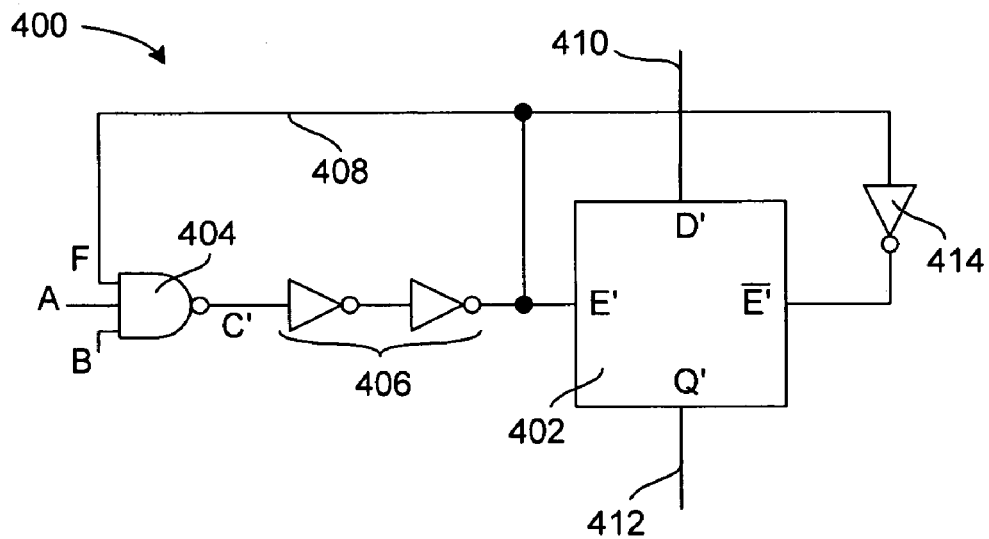
FIG. 4 is schematic diagram of a latch pulse delay circuit according to another embodiment of the present invention.

FIG. 4 shows a latch pulse delay circuit 400 according to another embodiment of the present invention. As shown in FIG. 4, latch pulse delay circuit 400 includes a latch 402, a three-input NAND gate 404, two delay inverters 406, and a feedback line 408 providing a third input to NAND gate 404. Note that in the present embodiment both of inverters 406 have substantially similar characteristics. Latch pulse delay circuit 400 produces a narrower enable pulse for latch 402 that is approximately as wide as the cumulative delay time in the circuit. In FIG. 4, the delay time is equal to the cumulative delay of the NAND gate 404, the inverters 406, plus any wire delay between NAND gate, inverters 406, and the latch 402. Having a narrower enable pulse is particularly beneficial for the case when the signal delay time through the latch pulse delay circuit is shorter than the width of a latch pulse applied to one of the circuit's inputs.

In this particular embodiment, the characteristics, and therefore the functionalities, of latch 402 are substantially the same as those described for latch 202 of FIG. 2. Accordingly, latch 402 includes an enable input port E', an inverted enable input port Ē', a data input port D', and a data output port Q'. Further, data input port D' and data output port Q' are connected to a data input wire 410 and a data output wire 412, respectively. The enable signal asserted on data input port E' is inverted through an inverter 414 for inverted enable input port Ē'. Note that the inputs and outputs of latch 402 are delineated with a prime symbol (') to easily distinguish them from the inputs of latch 202, which will be helpful in the description below.

NAND gate 404 includes an input port A, an input port B, a feedback input port F, and an output C'. Circuit 400 further includes a feedback line 408 connecting input port F to enable input port E'. Feedback line 408 is operable to produce a narrower enable pulse (approximately as wide as the delay time) in the case that signal delay is shorter than the width of a latch pulse applied to input port B. In particular, NAND gate 404 produces a low-going output C' when a high value is asserted on each of the inputs A, B, and F of NAND gate 404.

After a propagation delay through inverters 406, a low-going enable signal reaches enable input E' of latch 402, and is fed back to NAND gate 404 via feedback line 408. Note that the low-going enable signal on input E' causes data asserted on input terminal D' to be latched and asserted on output Q' of latch 402. Once the feedback signal on line 408 arrives at NAND gate 404, the output C' of NAND gate 404 becomes high, even if inputs A and B are still high themselves. Accordingly, the high output C' disables latch 402 (e.g., puts latch 402 in its quiescent state) once it reaches enable input E'. In other words, if the latch pulse asserted on B is substantially longer than the total latency of NAND gate 404 plus the latency of inverters 406, feedback line 408 will carry the low going enable signal back to NAND gate 404, and NAND gate 404 will then force latch 402 out of the enable state by asserting a logical high on input port E'. This will be apparent when referring to the corresponding timing diagram shown in FIG. 5.

Figure 5:
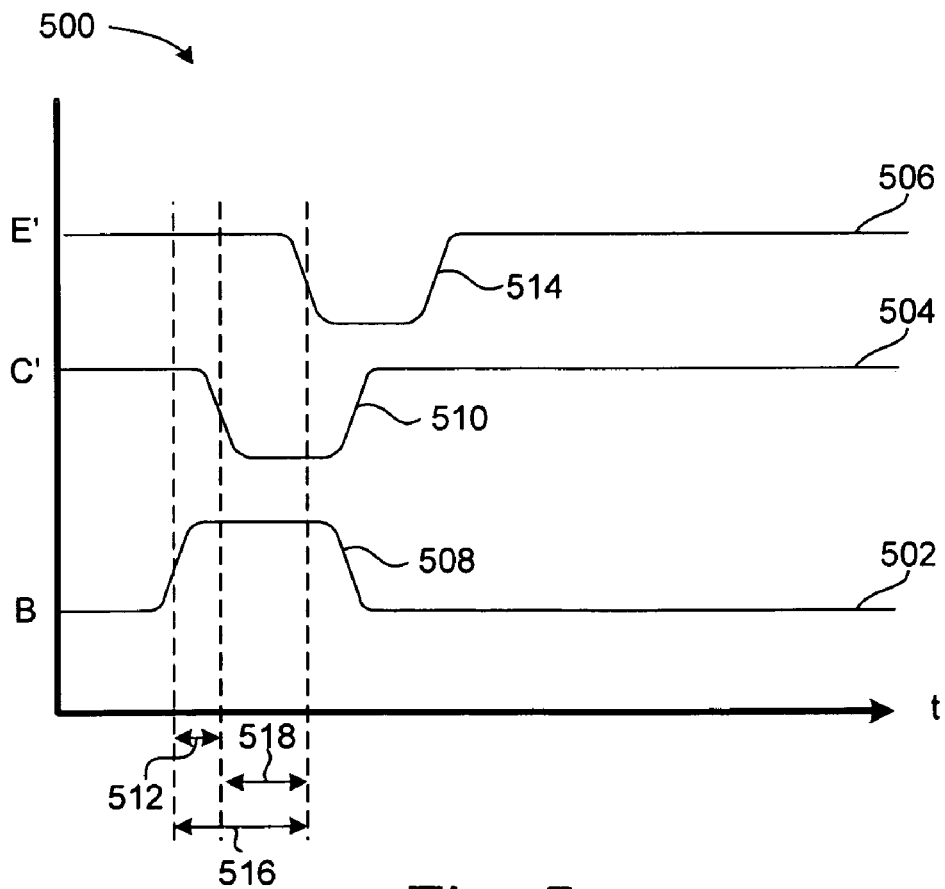
FIG. 5 is a timing diagram corresponding to the circuit of FIG. 4.

FIG. 5 is a timing diagram 500 corresponding to digital signals applied to latch pulse delay circuit 400 with respect to time. In FIG. 5, digital signals 502, 504 and 506 represent signal levels on input port B of NAND gate 404, output port C' of NAND gate 404, and input port E' of latch 402, respectively.

With reference made to FIG. 4, circuit 400 operates as follows. In circuit 400, a register select signal level 1 is applied to input port A of NAND gate 404, and a latch pulse 508 going from signal level 0 to 1, is applied to input port B of NAND gate 404. As discussed above, the register select signal can be generated by processor 108, a register or data stack in the computer 104, or by an instruction decoder circuit controlling the writing of data to RAM 110. The register select signal may also have a pulse width that is wider than latch pulse 508, beginning before and ending after the latch pulse 508. When all inputs A, B and F to NAND gate 404 are high, then a leading edge of a low-going pulse 510 of signal 504 arrives on output C' after a delay 512, which is the result of the time it takes for a signal applied to inputs A, B and F to be output at C'. The output at C' travels through inverters 406 and arrives as a low-going enable pulse 514 at E', after a time delay 516, determined by the number and characteristics of the circuit elements between input port B and input port E'. In the present embodiment, delay 516 is equal to the sum of delay 512, associated with NAND gate 404 and the total delay 518 of inverters 406 plus the wire delay. In this particular embodiment, delay 516 is shorter than the width of pulse 508. Accordingly, pulse 514 has approximately the same width as delay 516.

Circuit 400 is beneficial because it is able to close the latch 402 independently of the signal applied to the input B of NAND gate 404. In particular, the latch 402 is opened (i.e., enabled) on the rising edge of signal B (plus some delay), but the latch 402 is closed following the feedback delay through feedback line 408, the NAND gate 404, the inverters 406 and any wire delay. Advantageously, the latch pulse E' can be controlled by the feedback delay and is decoupled from the signal on input B, which is especially beneficial when the pulse signal on input B is greater than the duration of the delay 516. Limiting the duration of the delay in circuit 400 is important to minimize the hold time of the data asserted on data input wire 410 of latch 402. In contrast to circuit 400, in circuit 200 the rising edge of the signal on input B of NAND gate 204 opens the latch 202, and the falling edge of the signal on input B closes the latch 202.

Figure 6:
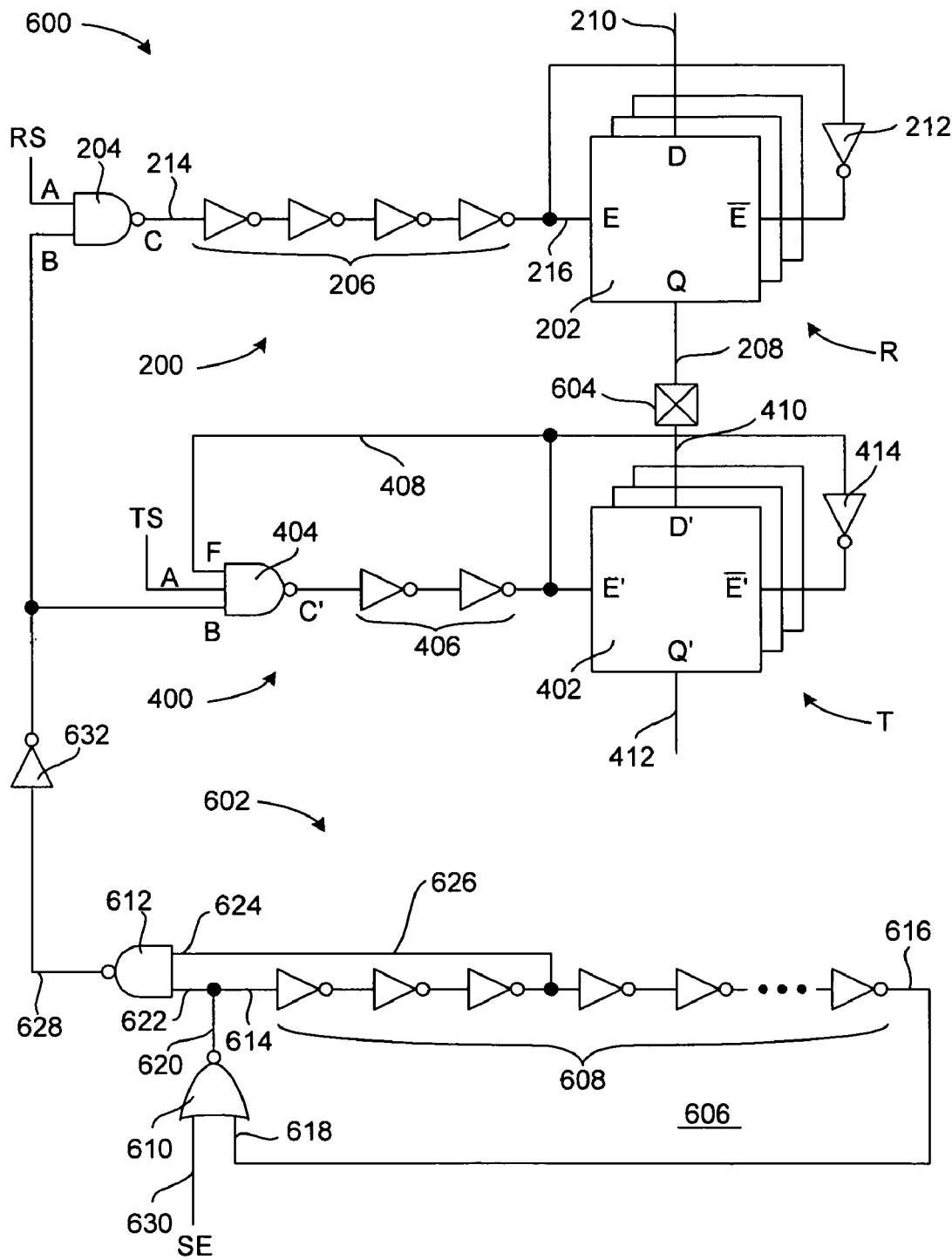
FIG. 6 is a schematic diagram of a circuit including the latch pulse delay circuits of FIG. 2 and FIG. 4.

FIG. 6 shows a circuit 600 that includes a latch pulse delay circuit 200 and a latch pulse delay circuit 400, both receiving latch pulses from a sequencer 602. In particular, sequencer 602 is shown connected both to input B of NAND gate 204 of circuit 200 and to input B of NAND gate 404 of circuit 400. Furthermore, in the present embodiment, memory latch 202 is part of a register R and latch 402 is part of a register T. Both registers R and T, for example, can be part of one or more data stacks in one of computers 104. Input A of NAND gate 204 and input A of NAND gate 404 are operable to receive register select signals RS and TS, respectively, which each originate in an associated computer 104. For example, the RS signal may be data from a Return Stack and the signal TS may be data from the Top of a (Data) Stack. Additionally, latches 202 and 402 are shown connected to each other via a pass gate 604 interposed between output wire 214 and input wire 410.

As shown in FIG. 6, sequencer 602 includes a loop 606 of inverters 608 (14 inverters 608 in the present embodiment), a NOR gate 610, and a two-input NAND gate 612. Inverters 608 and NOR gate 610 are shown in a feedback loop configuration. In particular, inverters 608 include an input end 614 and an output end 616. Output end 616 is connected to an input 618 of NOR gate 610, and the output 620 of NOR gate 610 is connected to input end 614 of inverters 608. NAND gate 612 has a first input 622 connected to output 620 of NOR gate 610 and to the input 614 of the inverters 608. NAND gate 612 also has a second input 624 connected between the output of the third inverter 608 and the input of the fourth inverter 608 via a wire 626. NAND gate 612 also includes a pulse line output 628 that transmits a low-going pulse train when a sequencer enable (SE) input 630 of NOR gate 610 is held low at logical value 0. The low-going pulse train output by sequencer 602 on output 628 is inverted by an inverter 632 and is provided as a high-going latch pulse train to the input B of each of latch pulse delay circuits 200 and 400. The sequencer can be shut off and the low-going pulse train stopped by asserting a logical 1 on SE input 630.

Sequencer 602 provides a means for asserting a series of pulses on the output 628. The time period between pulses of the pulse train output by sequencer 602 can be predetermined by the (even) number of inverters 608 used in loop 606. The time period between pulses is approximately twice the combined delay time of inverters 608 and NOR gate 610 plus wire delays therebetween. The number of inverters 608 can be varied to provide shorter or longer pulse repetition times, according to the desired application. Furthermore, the width of the output pulses on output 628 can also be predetermined by the (odd) number of inverters interposed between the position where the wire 626 connects to the loop 606 and the input 622 to NAND gate 612. The pulse width on the output 628 is approximately equal to the combined delay times of the odd number of inverters 608 plus the wire delays between input 622 and the position where wire 626 connects to the loop 606 of inverters 608. Although there are three inverters shown interposed between wire 626 and input 622, different pulse widths can be achieved by interposing different numbers of inverters between input 622 and the connection of wire 626 to the loop 606 of inverters 608.

Figure 7:
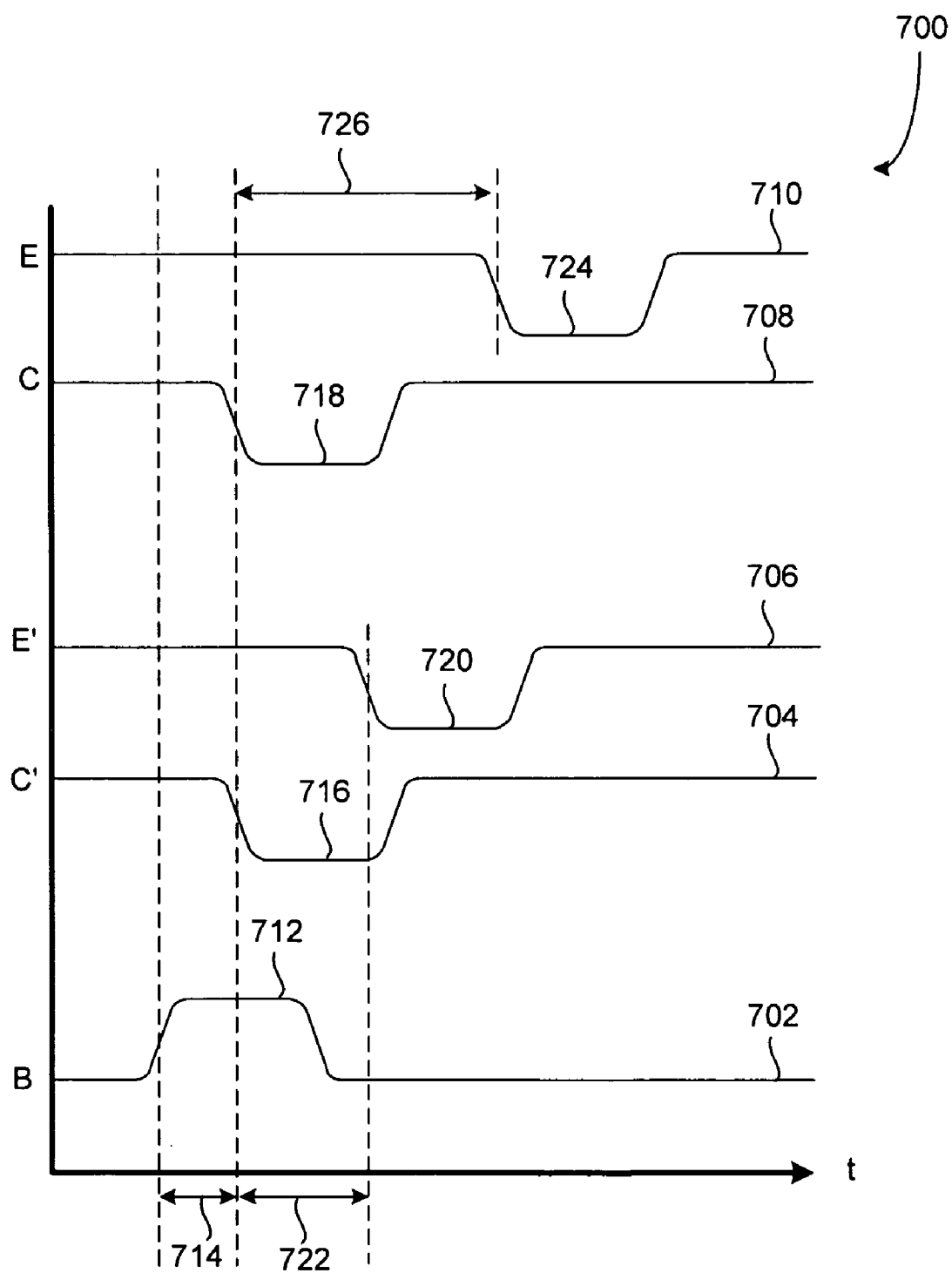
FIG. 7 is a timing diagram corresponding to the circuit of FIG. 6.

FIG. 7 shows a timing diagram 700 corresponding to digital signals within circuit 600 with respect to time. As shown in FIG. 7, digital signal 702 represents signal levels applied simultaneously to input B of NAND gate 204 and input B of NAND gate 404. Digital signals 704 and 706 represent digital signal levels at output C' of NAND gate 404 and input E' of latch 402, respectively. Similarly, digital signals 708 and 710 represent digital signal levels at output C of NAND gate 204 and input E of latch 202, respectively. To provide a better understanding of the timing relationship of signals applied to circuit 600, it will be assumed that the register select signals RS and TS are both being asserted (e.g., logical highs).

With reference to FIGS. 6 and 7, circuit 600 operates as follows. Inverter 632 simultaneously asserts a high-going pulse 712 on inputs B of NAND gates 204 and 404 according to the signals on output 628 of sequencer 602. After one NAND gate delay time interval 714, NAND gates 404 and 204 output low going pulses 716 and 718 on outputs C' and C, respectively. Enable input E' receives a low-going enable pulse 720, a delay time interval 722 after pulse 716 begins, where the delay time interval 722 is approximately equal to the latency periods of both of inverters 406 (and any wire delay) in circuit 400. Similarly, enable input E receives a low going pulse 724, a delay time interval 726 after pulse 718 begins, where the delay time interval 726 is approximately equal to the latency period of the four inverters 206 (and any wire delay) in circuit 200. It should be noted that according to the present example, the sum of the delays 714 and 722 is greater than width of the pulse 712. However, if the sum of the latencies 714 and 722 were less than the width of the pulse 712, then circuit 400 would limit the width of pulse 720 to approximately the sum of the delays 714 and 722.

As shown by FIG. 7, latch 402 is enabled (responsive to enable pulse 720) before latch 202 such that data will be transferred from latch 202 to latch 402 before new data from wire 210 is latched into latch 202 (responsive to the enable pulse 724). If, to the contrary, both latches 202 and 402 were in the enable state at the same time, with appropriate consideration for delays within a latch, latch 402 would receive first the data stored in latch 202 and then the new data from wire 210, all within the same latch cycle. Of course, this would be an undesirable mistiming event which is advantageously prevented by the present invention. In other words, the latch pulse delay circuits of the present invention facilitate customizable latch delay times that ensure the proper sequential operation of the latches (e.g., latches 202 and 402) within the computers 104.

Furthermore, in high speed circuits and depending on circuitry layout, the wire delay from sequencer 602 to one of the circuits 200 and 400 can be significantly longer than the delay from the sequencer 602 to the other circuits 200 and 400. Accordingly, the present invention also provides the useful advantage that such wire delays can be compensated for by increasing or decreasing the number of inverters in circuits 200 and 400 as needed. Thus, this aspect of the present invention also ensures appropriate sequential operation of the latches.

Because the present invention provides the ability to customize sequential operation of data latches, the present invention is especially beneficial in the asynchronous operation of the computers 104 that are integrated on the single die 102. For example, multiple latches (e.g., in memories, registers, or data stacks) within the computers 104 can transfer data according to a predetermined sequence or speed after a single latch pulse is delivered to the multiple latches.

Figure 8:
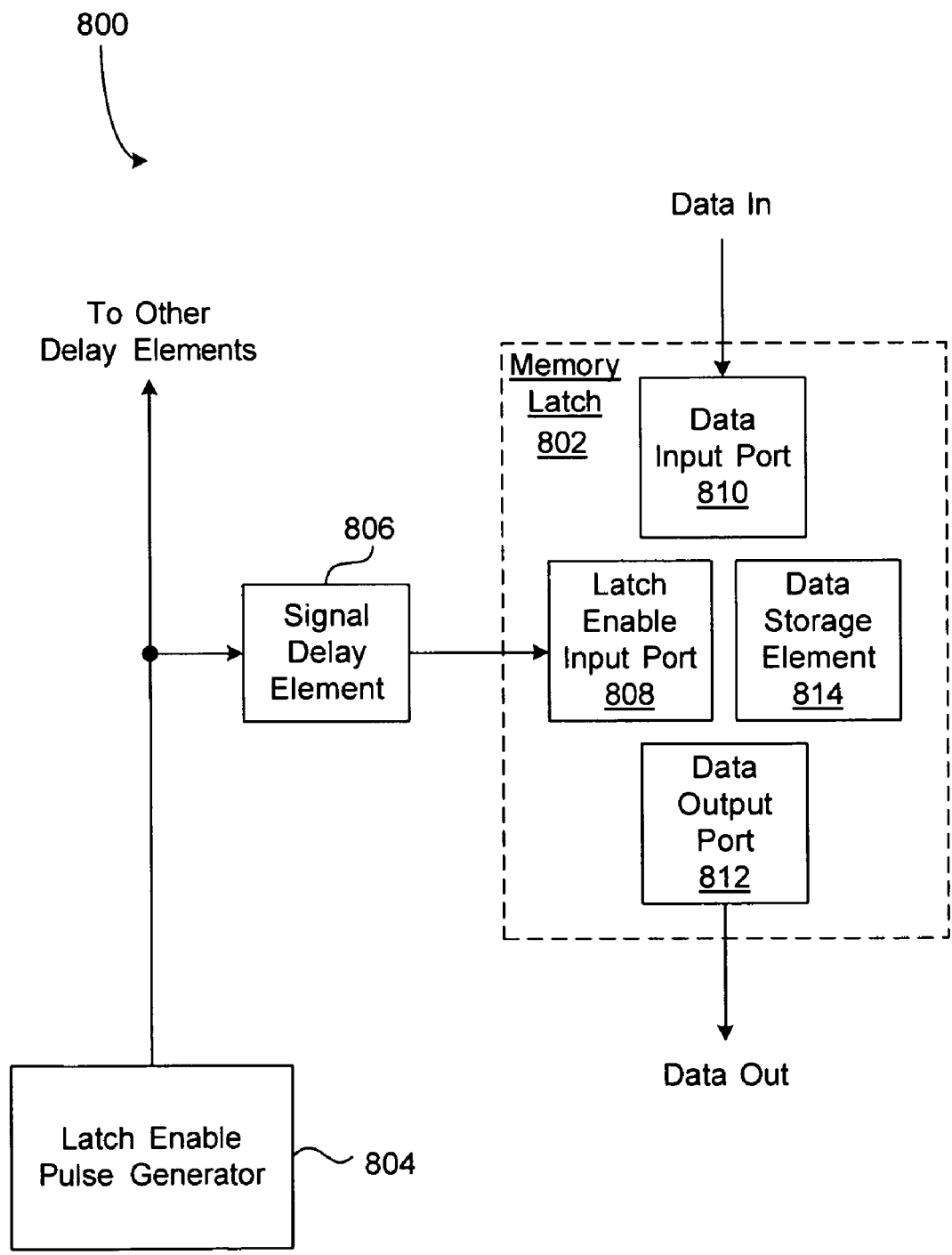
FIG. 8 is a block diagram of a latch pulse delay circuit according to still another embodiment of the present invention.

FIG. 8 is a block diagram showing a latch pulse delay control apparatus 800 according to the present invention. Apparatus 800 includes a memory latch 802, coupled to a latch enable pulse generator 804 via a signal delay element 806. Memory latch 802 includes a latch enable input port 808, a data input port 810, a data output port 812, and data storage block 814. Latch enable pulse generator 804 outputs a series of digital signals that selectively enable memory latch 802 to latch data applied to data input port 810 into data storage block 814. Memory latch 802 is further operative to output the data stored in data storage block 814 onto data output port 812. Signal delay element 806 increases the time it takes for memory latch 802 to receive the enable signal output by latch enable pulse generator 804 on latch enable input port 808. In a particular embodiment, the amount of delay that signal delay element 806 can introduce into enable signal output by latch enable pulse generator 804 is variable, such that the delay can be customized to a particular application. It should be understood that signal delay element 806 is operable to increase the signal delay time between pulse generator 804 and latch enable input port 808 beyond the inherent wire delay caused by the electrical connections between the elements of apparatus 800.

The description of particular embodiments of the present invention is now complete. Many of the described features may be substituted, altered or omitted without departing from the scope of the invention. It should be apparent to those skilled in the art that although latch delay circuits with four and two inverters are shown herein, different numbers of inverters can be employed in alternate embodiments of the invention to accomplish the same purpose of ensuring appropriate sequential operation of the latches. It should be further apparent that although particular multi-input gates, and particular assignments of input ports, such as the conventional designations A and B, are shown and described hereinabove, other permutations of input port assignments can be employed. Further, other choices and combinations of basic multi-input gates that provide the same Boolean function can alternatively be employed to accomplish the same function without deviating from the scope of the invention. Yet further, it should be apparent that other known types of pulse generators can alternatively be employed in place of sequencer 602, to provide latch pulses. These and other deviations from the particular embodiments shown will be apparent to those skilled in the art, particularly in view of the foregoing disclosure.

I claim:

1. A latch pulse delay circuit comprising:
    a first memory latch including a latch enable port, a data input port, and an output port, said first memory latch being responsive to store a signal applied to said data input port when said latch enable port receives a predetermined signal;
    a pulse line operative to provide electrical pulse signals;
    a first pulse delay element electrically interposed between said pulse line and said latch enable port of said first memory latch; and
    wherein said first pulse delay element imparts a predetermined latency to said pulse signals moving from said pulse line to said latch enable port of said first memory latch.

2. A latch pulse delay circuit according to claim 1, wherein said first pulse delay element includes at least one logic gate operative to increase the time it takes for said electrical pulse signals to move from said pulse line to said latch enable port of said first memory latch.

3. A latch pulse delay circuit according to claim 2, wherein said first pulse delay element includes a plurality of inverters connected in series, said plurality of inverters electrically interposed between said pulse line and said latch enable port of said first memory latch.

4. A latch pulse delay circuit according to claim 3, wherein said first pulse delay element includes an even number of inverters.

5. A latch pulse delay circuit according to claim 2, wherein:
    said at least one logic gate includes an enable gate having a first input port, a second input port, and an output port, said first input port electrically coupled to said pulse line, said second input port electrically coupled to a select line, and said output port electrically coupled to said latch enable port of said first memory latch; and
    said enable gate is operative to output a latch enable signal in response to the signals asserted on said first input port and said second input port of said enable gate.

6. A latch pulse delay circuit according to claim 5, wherein said enable gate is a NAND gate operable to output said latch enable signal in response to simultaneous logical high signals asserted on said first input port and said second input port.

7. A latch pulse delay circuit according to claim 5, further comprising a feedback line having a first end electrically coupled to said latch enable port of said first memory latch and a second end electrically coupled to a third input port of said enable gate.

8. A latch pulse delay circuit according to claim 1, further comprising:
    a second memory latch including a latch enable port, a data input port, and an output port, said second memory latch operative to store a signal asserted on said data input port of said second memory latch when said latch enable port of said second memory latch receives a predetermined signal;
    a second pulse delay element electrically interposed between said pulse line and said enable port of said second memory latch, said second pulse delay element imparting a predetermined latency to said pulse signals moving from said pulse line to said enable port of said second memory latch; and
    wherein said predetermined latency caused by said first pulse delay element is greater than said predetermined latency caused by said second pulse delay element.

9. A latch pulse delay circuit according to claim 8, wherein:
    said first pulse delay element includes a first number of logic gates; and
    said second pulse delay element includes a second number of logic gates, said second number of logic gates being less than said first number of logic gates.

10. A latch pulse delay circuit according to claim 8, wherein said data input port of said second memory latch is electrically connected to said data output port of said first memory latch.

11. A latch pulse delay circuit according to claim 8, wherein:
    said second pulse delay element includes at least one logic gate operative to increase the time it takes for said electrical pulse signals to move from said pulse line to said latch enable port of said second memory latch;
    said at least one logic gate includes an enable gate having a first input port, a second input port, and an output port, said first input port electrically coupled to said pulse line, said second input port electrically coupled to a select line, and said output port electrically coupled to said latch enable port of said second memory latch; and
    said enable gate is operative to output a latch enable signal in response to the signals asserted on said first input port and said second input port of said enable gate.

12. A latch pulse delay circuit according to claim 11, further comprising a feedback line having a first end electrically coupled to said latch enable port of said second memory latch and a second end electrically coupled to a third input port of said enable gate.

13. A latch pulse delay circuit according to claim 8, further comprising a sequencer electrically coupled to said pulse line, said sequencer operative to assert a series of pulses on said pulse line.

14. A latch pulse delay circuit according to claim 13, wherein, responsive to said sequencer asserting one of said pulses on said pulse line, said first memory latch is operative to store said signal asserted on said data input port of said first memory latch after said second memory latch stores said signal asserted on said data input port of said second memory latch.

15. A latch pulse delay circuit according to claim 1, further comprising a sequencer electrically coupled to said pulse line, said sequencer operative to assert a series of pulses on said pulse line.

16. A latch pulse delay circuit according to claim 1, wherein said first memory latch is a register in a data stack in a computer.

17. A latch pulse delay circuit comprising:
- a first memory latch including a latch enable port, a data input port, and a data output port, said first memory latch operative to store a signal asserted on said data input port when said latch enable port receives a predetermined signal;
- a pulse line operative to provide electrical pulse signals, said pulse line being electrically coupled to said latch enable port; and
- means for increasing the time it takes said pulse signals to reach said latch enable port.

18. A latch pulse delay circuit according to claim 17, further comprising:
- a second memory latch including a latch enable port electrically coupled to said pulse line, a data input port, and a data output port, said second memory latch operative to store a signal asserted on said data input port of said second memory latch when said latch enable port of said second memory latch receives a predetermined signal; and
- means for increasing the time it takes said pulse signals to reach said latch enable port of said second memory latch.

19. A latch pulse delay circuit according to claim 18, further comprising means for asserting a series of pulses on said pulse line.

* * * * *